US007352307B2

(12) United States Patent
Iorgulescu

(10) Patent No.: US 7,352,307 B2
(45) Date of Patent: Apr. 1, 2008

(54) COMPARATOR CHAIN OFFSET REDUCTION

(75) Inventor: Mihu Iorgulescu, Bucuresti (RO)

(73) Assignee: ATMEL Corporation, San Jose, CA (US)

( * ) Notice: Subject to any disclaimer, the term of this patent is extended or adjusted under 35 U.S.C. 154(b) by 0 days.

(21) Appl. No.: 11/351,877

(22) Filed: Feb. 9, 2006

(65) Prior Publication Data
US 2007/0182606 A1    Aug. 9, 2007

(51) Int. Cl.
*H03M 1/10* (2006.01)
(52) U.S. Cl. .................. 341/118; 341/120; 327/307
(58) Field of Classification Search .......... 341/118, 341/120; 327/307, 315, 316, 331, 332
See application file for complete search history.

(56) References Cited

U.S. PATENT DOCUMENTS

| 4,251,803 | A |   | 2/1981  | Debord et al. |
|-----------|---|---|---------|---------------|
| 4,380,005 | A |   | 4/1983  | Debord et al. |
| 4,996,529 | A | * | 2/1991  | Connell ............... 341/118 |
| 5,017,805 | A | * | 5/1991  | Kase ................. 327/307 |
| 5,061,900 | A |   | 10/1991 | Vinn et al. |
| 5,920,273 | A |   | 7/1999  | Hirano |
| 5,990,814 | A |   | 11/1999 | Croman et al. |
| 6,507,241 | B1| * | 1/2003  | Ritter ............... 327/307 |
| 6,794,920 | B1| * | 9/2004  | Aliahmad et al. ...... 327/307 |
| 6,822,501 | B2|   | 11/2004 | Kinugasa |
| 6,847,320 | B1|   | 1/2005  | Taft et al. |
| 6,900,750 | B1| * | 5/2005  | Nairn ................. 341/118 |
| 6,982,664 | B1| * | 1/2006  | Nairn ................. 341/118 |
| 2003/0117205 | A1 | * | 6/2003 | Cahalane et al. ....... 327/307 |
| 2003/0154045 | A1 | * | 8/2003 | Sung et al. ............ 702/107 |
| 2005/0219090 | A1 |   | 10/2005 | Jonsson et al. |

OTHER PUBLICATIONS

Richard Fung, "Improving Accuracy of Analog-to-Digital Converters," Nov. 14, 2002, [retrieved on Oct. 10, 2007]; Retrieved from the Internet <URL: http://www.eecg.utoronto.ca/~kphang/papers/2002/rfung_AccuracyXofXADCs.pdf>.
Wong, et al., "Offset Compensation in Comparators With Minimum Input-Referred Supply Noise", IEEE Journal of Solid-State Circuits, vol. 39, No. 5, May 2004 [online], [retrieved on Oct. 10, 2007]; Retrieved from the Internet <URL: http://www.ee.ucla.edu/~ckygroup/papers/wong_issc_may04.pdf>.

* cited by examiner

*Primary Examiner*—Howard Williams
(74) *Attorney, Agent, or Firm*—Fish & Richardson P.C.

(57) ABSTRACT

Comparator chain total offset, static and dynamic, is reduced by injecting a compensation quantity in at least one point in the chain of comparator components. The compensation quantity is determined by providing the comparator chain with calibration signals having equal values and evaluating the output states of the comparator chain. The compensation quantity is adjusted until the probabilities of high and low output states are substantially equal and a calibrated value for the compensation is determined.

16 Claims, 3 Drawing Sheets

COMPARATOR CHAIN OFFSET REDUCTION

TECHNICAL FIELD

The disclosed implementations relate generally to electrical circuits.

BACKGROUND

A conventional latched comparator has two input signals and outputs a decision regarding the relative value of the input signals every comparator clock cycle. For example, assuming one of the inputs is a reference signal, when the non-reference input signal value is greater than the reference signal value, the output decision of the comparator is high, and when the non-reference input signal value is less than the reference signal value the output decision of the comparator is low. When the signal and reference values are equal, the comparator output enters an unpredictable state. In practice, with equal inputs, the output will dither between low and high values due to noise with high and low output values being equally probable. When the input signal value deviates from the reference signal value, the probabilities of high and low output states increase or decrease with a normal probability distribution function characterized, in some circuits, by a standard deviation equal to the input referred noise Root Mean Square (RMS) value.

In addition to noise, a comparator device can be affected by systematic and/or random unbalancing factors, so that even in the case of equal inputs, the output decisions are not evenly distributed between high and low states. These unbalancing factors can be static or dynamic. Static unbalancing factors can include offset voltages resulting from unequal threshold voltages (e.g., in CMOS related technologies), or unequal currents flowing through various circuit branches, or unequal physical dimensions of transistors.

Dynamic unbalancing factors can include unbalanced charges in the channels of transistors used as switches in the comparator chain. These unbalanced charges can be injected in various nodes into the comparator chain when the switches are turned off. Additionally, unbalanced charge transfer can occur in transistors used in feedback circuitry associated with a track-and-latch stage of a comparator chain. Due to static and dynamic unbalancing factors, a comparator device may not output a balanced probability of high and low output states when the input signals are equal. Unbalancing factors become even more problematic in practical realizations of comparator chains that include one or more preamplifier stages followed by a track-and-latch comparator or decision stage. Each stage in the comparator chain can be affected by unbalancing factors that can contribute to offsets. Accordingly, it is possible that the main contributors of static and dynamic unbalancing factors, although having unpredictable values, are fixed once a circuit is fabricated, since solid state circuits, and therefore the associated unbalancing factors, tend not to change during normal circuit operation.

There are also time variant unbalancing factors which can appear in a comparator chain. Generally, time variant unbalancing factors are random in nature and can be attributed to noise which adds to the input noise and noise generated by solid state circuit elements in the comparator chain.

SUMMARY

Comparator chain total offset, static and dynamic, is reduced by injecting a compensation quantity in at least one point in the chain of comparator components. The compensation quantity is determined by providing the comparator chain with calibration signals having equal values and evaluating the output states of the comparator chain. The compensation quantity is adjusted until the probabilities of high and low output states are substantially equal and a calibrated value for the compensation is determined.

In some implementations, a calibration system for a comparator chain includes a comparator configured for receiving a signal flow. An unbalancing element is coupled to the comparator and configured to add an unbalancing quantity to the signal flow in at least one point of the comparator chain. A compensation circuit is coupled to the comparator and the unbalancing element, and is configured to monitor output states of the comparator to determine if the output states are associated with a desired distribution. If the output states are not associated with a desired distribution, the unbalancing quantity is adjusted based on a current distribution of the output states.

In some implementations, a method of calibrating a comparator chain includes: providing a signal flow to a comparator chain; monitoring output decisions of the comparator chain; determining if the output decisions are associated with a desired distribution; if the output decisions are not associated with the desired distribution: determining an unbalancing quantity based on current distribution associated with the output decisions; adding the unbalancing quantity to the signal flow in at least one point of the comparator chain; and repeating the monitoring step.

The disclosed implementations provide an advantage over conventional techniques by compensating in a global manner all the offsets in the comparator chain, static and dynamic, which are time invariant. This compensation takes place in the presence of noise (e.g., present at the input or added by the comparator chain) using the distribution characteristics of the outputs states of the comparator chain which are generated by the noise.

Other implementations are disclosed which are directed to systems, methods and devices having one or more of the various features described below.

DETAILED DESCRIPTION

Comparator Chain with Offset Compensation Circuitry

Figure 1:
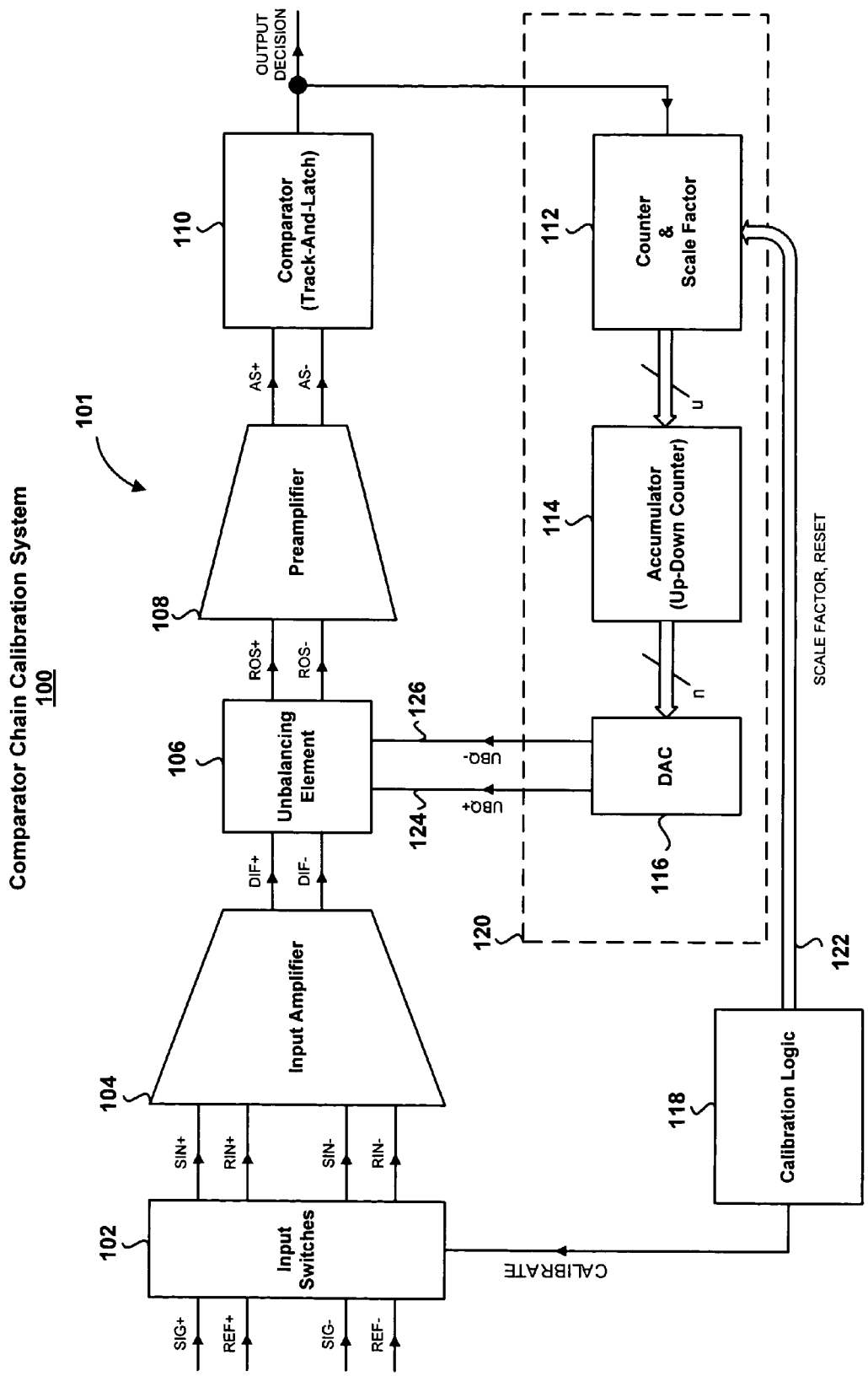
FIG. 1 is a block diagram of an exemplary comparator chain calibration system.

FIG. 1 is a block diagram of an exemplary comparator chain calibration system 100. In some implementations, the calibration system 100 includes a differential comparator chain 101 and an offset compensation circuit 120. The comparator chain 101 includes input switches 102, input amplifier 104, unbalancing element 106, optional preamplifier 108 and track-and-latch comparator 110. It should be apparent that the differential comparator chain 101 is one possible configuration of a comparator chain and other configurations are possible with more or fewer components. For example, in some implementations there can be more than one preamplifer 108. Although the calibration system 100 is shown configured for processing differential signals, the calibration system 100 could also be adapted for use with single-ended signaling technology.

Referring to the inputs of the input switches 102, the signals SIG+ and SIG− are differential input signals and the signals REF+ and REF− are differential reference values. In normal operation mode, the inputs to the input switches 102 are simply passed to the outputs of input switches 102, i.e., SIN+=SIG+, RIN+=REF+, SIN−=SIG− and RIN−=REF−. In calibration mode, a calibration mode signal (CALIBRATE) commands the input switches 102 to couple the reference values REF+ and REF− to the differential inputs of the input amplifier 104, i.e., SIN+=RIN+=REF+ and SIN−=RIN−=REF−. Since the comparator chain 101 is provided with equal input values, the expected digital output decisions (also referred to as "output states") of the comparator 110 should be evenly distributed between high and low values (e.g., logic "1" and "0"). In some implementations, the calibration mode can be initiated by the calibration logic 118 during power-up, wake-up or any other suitable trigger event. In other implementations, the calibration mode can be scheduled to run at a specific time (e.g., every t time interval) or every m comparator clock cycles. Note that in calibration mode the reference values REF+ and REF− are also referred herein as "calibration signals."

The outputs of the input switches 102 are coupled to the inputs of the input amplifier 104. In some implementations, the input amplifier 104 is a high speed, low gain circuit that can be realized with a double differential pair. The input amplifier 104 generates at its outputs differential signals DIF+ and DIF− that are proportional to the difference between the input signals received from the input switches 102, which can be expressed mathematically as follows:

$$DIF+-DIF-=GAIN*[(SIN+-SIN-)-(RIN+-RIN-)]. \quad (1)$$

The differential signals DIF+ and DIF− are coupled to the unbalancing element 106, which can be configured to add differential unbalancing quantities UBQ− and UBQ+ to the differential signals DIF+ and DIF− to correct for total offset error in the comparator chain 101. The total offset error is composed of error contributions, static and dynamic, from all components in the comparator chain 101. The unbalancing element 106 is shown configured as an independent block for clarity purposes, but may be realized through the loads of the input amplifier 104. For example, the unbalance lines 124, 126, can be connected directly to the outputs of the input amplifier 104. In one or more configurations, the unbalancing element 106 can include one or more components (e.g., current sources, or other components). Other configurations are possible.

In some implementations, the outputs of the unbalancing element 106 are coupled directly to the inputs of the track-and-latch comparator 110. In other implementations, such as the implementation shown in FIG. 1, the outputs of the unbalancing element 106 are coupled to the inputs of a preamplifier 108 and provide compensated differential signals ROS+, ROS− to the preamplifier 108. Because the offset compensation circuitry 120 can have a limited operating range, the preamplifier 108 is inserted before the track-and-latch comparator 110, which in many cases provides the greatest contribution to the total offset of the comparator chain. The preamplifier 108 can be a high speed and relatively low gain circuit.

The preamplifier 108 provides amplified differential signals AS+, AS−, which are input to the track-and-latch comparator 110 (hereinafter also referred to as "comparator 110"). In some implementations, the comparator 110 is configured to track and latch the amplified differential signal AS+, AS−, and provides a digital output decision based on the differential signal AS+, AS−, e.g., a high or low state.

Offset Compensation Circuitry

The digital output decision of the comparator 110 is input to the offset compensation circuitry 120. In some implementations, the offset compensation circuitry 120 includes an optional counter & scale factor block 112, an accumulator 114 and an n-bit digital-to-analog converter (DAC) 116. The counter and scale factor block 112 determines if the output decisions have a desired probability distribution by monitoring the output decisions. For example, the counter and scale factor block 112 can include an up/down counter that can be configured to count the number of output decisions over n comparator clock cycles and then compare the count to a threshold value to determine the current probability distribution of the output decisions of the comparator 110. Differential unbalancing quantities UBQ− and UBQ+ can be determined based on the comparison and added to the differential input signals DIF+ and DIF−. If the count is skewed to low states (e.g., below a predetermined low threshold), then the counter and scale factor block 112 can issue an Up command (e.g., a u-bit digital code) to the input of the accumulator 114. The Up command causes the differential unbalancing quantity (UBQ+−UBQ−) to be incremented (e.g., higher current or voltage). The unbalancing quantities UBQ− and UBQ+ are added to the differential signals DIF+ and DIF− through the unbalancing element 106. Similarly, if the count is skewed to high states (e.g., above a predetermined high threshold), then the counter and scale factor block 112 can issue a Down command to the input of the accumulator 114. The Down command causes the differential unbalancing quantity (UBQ+−UBQ−) to be decremented (e.g., lower current or voltage). If the count is zero or within an acceptable tolerance (between the high and low thresholds), then the counter and scale factor block 112 can issue a Hold command to the input of the accumulator 114. The Hold command causes the differential unbalancing quantity (UBQ+−UBQ−) to be held at their current value. Thus, a Hold command is issued when the probabilities of high and low states are substantially equal (or within a predetermined tolerance) for a predetermined number of comparator clock cycles, indicating that the output decisions of the comparator 110 have converged to a steady state of high and low states that occur with equal or acceptable probability.

An example of a u-bit digital code that can be used to command the accumulator 114 is a 2-bit code: 00—Hold, 01—UP and 10—Down. Other codes are possible. The unbalancing quantities UBQ+ and UBQ− can be added in at any point in the comparator chain, and can also be added in at multiple points in the comparator chain.

In some implementations, the counter and scale factor block 112 includes a scale factor for controlling the speed of convergence and the variance of the output of the accumulator 114 at convergence. For simple circuit realizations, the scale factor can be set equal to one. With a scale factor of one, the counter and scale factor block 112 detects every output decision of the track-and-latch comparator 110 and issues an Up or Down command to the accumulator 114 based on the output decision. For example, during a first comparator clock cycle if the output decision is high, then the counter and scale factor block 112 issues a Low command to the accumulator 114. If the output decision is low during the next comparator clock cycle, then the counter and scale factor block 112 issues a High command to the accumulator 114. In other embodiments, the scale factor can be programmed by the calibration logic 118 on bus 122 to optimize various parameters of calibration, as described with respect to FIG. 2.

In some implementations, the n-bit DAC 116 generates the differential unbalancing quantities UBQ– and UBQ+ and is driven by an n-bit digital code generated by the accumulator 114, which develops a digital compensation value over more groups of n comparator clock cycles. The DAC 116 maps the digital code to an incremental analog quantity (e.g., currents or voltages). The mapping can be linear or non-linear. For example, digital codes having lower values can be mapped to smaller increments or decrements than higher (in absolute value) digital codes. The accumulator 114 can be implemented with a conventional up/down counter using known digital circuit designs. It should be apparent that the accumulator 114 allows the offset compensation value to be held during normal operation of the circuit. Thus, in contrast to some conventional offset compensation schemes, the calibration system 100 need only be executed in response to trigger events, such as after power-up or wake-up from a standby mode, and not continuously operated during normal circuit operation, as is required by some conventional calibration systems for comparator chains.

Counter and Scale Factor Circuit Operation

Figure 2:
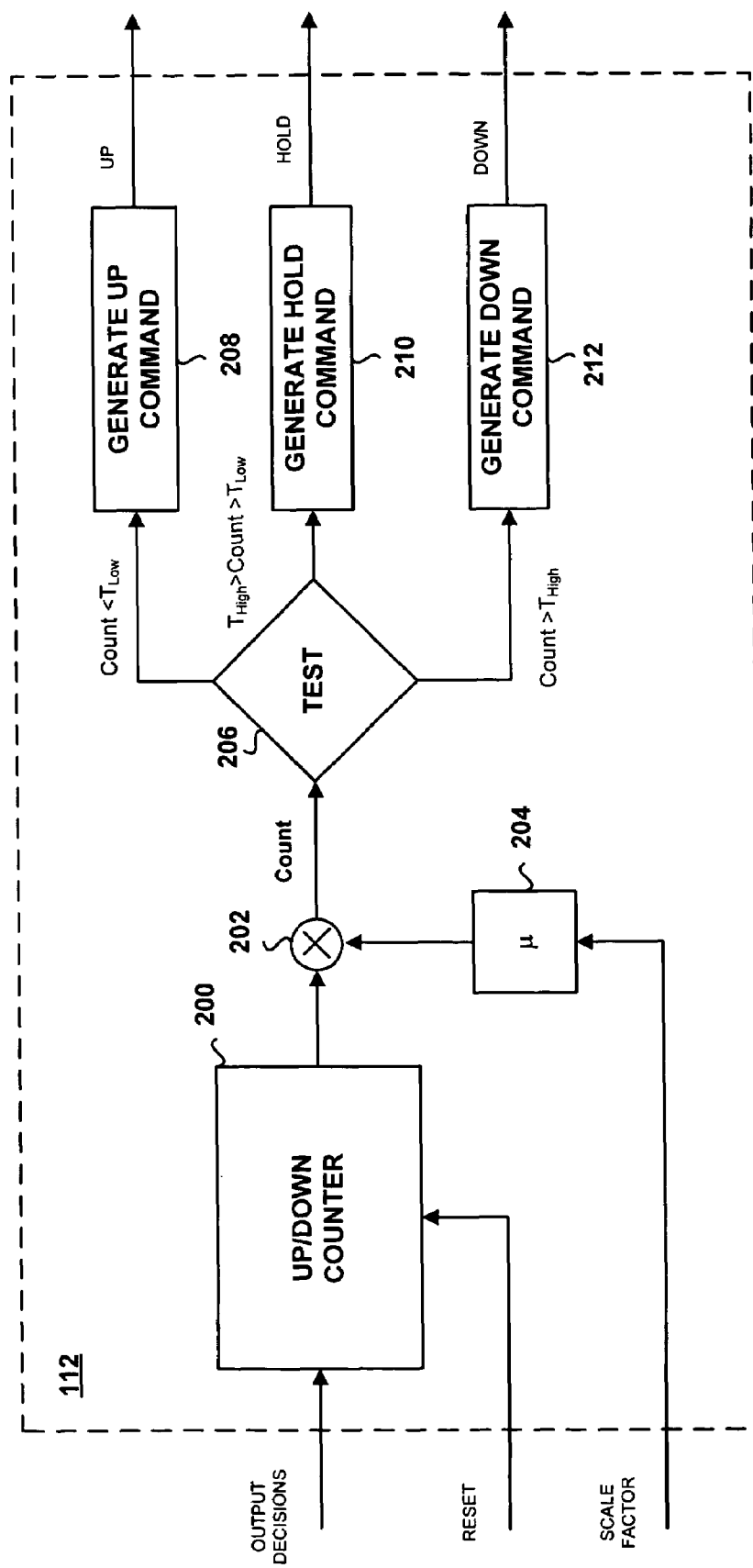
FIG. 2 is a block diagram of an exemplary counter and scale factor block.

FIG. 2 is a block diagram of an exemplary counter and scale factor block 112. In some implementations, the block 112 includes an up/down counter 200, a multiplication block 202, a test block 206, an Up code generator 208, a Hold code generator 210 and a Down code generator 212. The counter 200 can be a conventional up/down counter composed of flip flops and other logic devices for counting high and low pulses on a input line. The multiplication block 202 can be a conventional shift register or other logic device that can perform binary multiplication. The test block 206 can include logic (e.g., AND gates, OR gates, etc.) for comparing the contents of the counter 200 (i.e., the current count) against high and low threshold values ($T_{Low}$, $T_{High}$). In some implementations, the count can be compared against a single threshold value (e.g., zero). The code generators 208, 210 and 212 can include logic and other electronic components for distinguishing between values less than, greater than and equal to respective thresholds and for applying suitable signal conditioning to generate the Up, Down and Hold codes to the accumulator 114 (e.g., comparators, drivers, transistors, pull-up resistors, etc.).

During calibration mode, the output decisions of the comparator 110 drives the counter 200, which performs counting cycles having a number of n counting steps. The number of counting steps can be fixed or programmed by, for example, the calibration logic 118 using bus 122. After a number of counting steps have completed, the counter 200 passes its register contents (i.e., the current count) to the multiplication block 202, and the counter 200 is reset to begin a new counting cycle. At limit, the count cycle can have only one clock cycle. In some implementations, the counter 200 is reset by a RESET signal generated by the calibration logic 118 and transmitted over bus 122.

In the multiplication block 202, the contents of counter 200 is multiplied by a fixed or programmable scale factor 204 ($\mu$). In some implementations, the scale factor can be in the form of $2^{-k}$ and can be implemented with a shift register that can be configured to shift by k positions (e.g., right shift). After the multiplication block 202, the register content is tested in a test block 206 to determine which of the signal generators 208, 210, 212, will be triggered. In some implementations, the test block 206 tests for three conditions. If the contents of the counter 200 (Count) is less than the low threshold value (Count<$T_{Low}$), the Up signal generator 208 generates an Up code. If the contents of the counter 200 is between the high and low threshold values ($T_{High}$>Count>$T_{Low}$), the Hold signal generator 210 generates a Hold code. If the contents of the counter 200 is greater than the high threshold value (Count>$T_{High}$), the Down code generator 212 is triggered. Although the signal generators 208, 210 and 212 are shown in FIG. 2 as separate components they can be combined in a single block and share one or more components. In some implementations, some or all the thresholds can be replaced with threshold bands. For example, if the contents of the counter 200 is between counts X and Y (e.g., between +3 and –3), the Hold signal generator 210 generates a Hold signal.

The output of comparator 110 drives the counter 200 in such a manner that a negative feedback loop formed by the unbalancing block 106, the comparator 110 and the offset compensation block 120 causes the output decisions of the comparator 110 to converge towards a stable state in which high and low output decisions are equally probable. The scale factor 204 can be used to control the convergence speed of the negative feedback loop and can be set to an initial value (e.g., one or $2^0$) for a predetermined number of counting cycles to accelerate the initial phase of the convergence process. Because the scale factor 206 can also control the variance of the feedback loop at convergence, it can then be adjusted or replaced in later phases of convergence to reduce the variance of the accumulator 114 contents at convergence. The optimal values for the number of steps in a counting cycle and for the scale factor 206 are dependent on the DAC 116 increment and noise on the comparator chain 101, which can be computed based on measurements, knowledge or some assumption about the noise on the comparator chain 101. It should be apparent that other forms of scale factors are possible depending on the design of the negative feedback loop.

Comparator Chain Compensation Process

Figure 3:
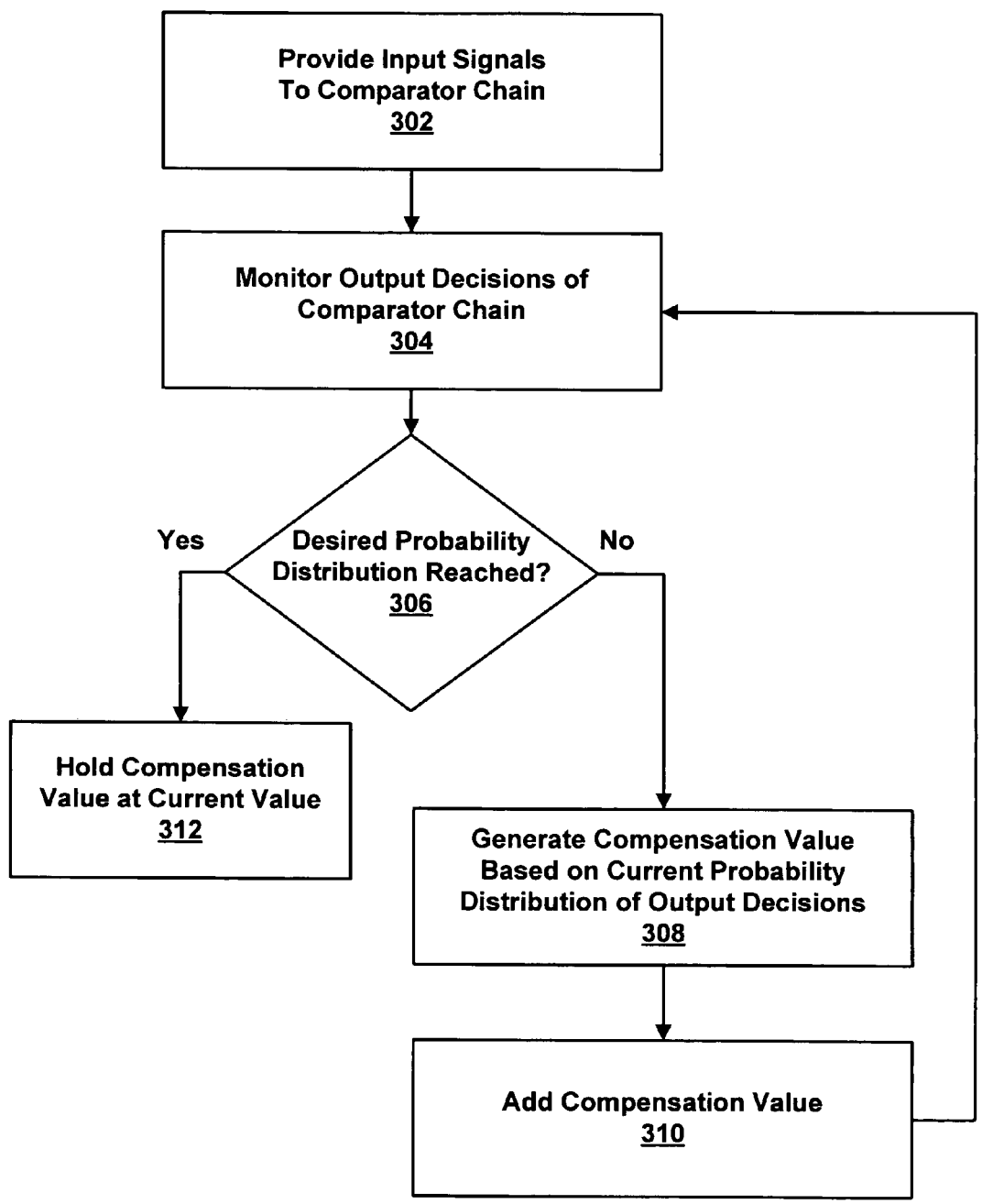
FIG. 3 is flow diagram of an exemplary comparator chain calibration process.

FIG. 3 is flow diagram of an exemplary comparator chain calibration process 300. The steps of the process 300 need not occur in any specific order and at least some steps can occur in parallel. The process 300 begins by providing calibration signals to the comparator chain (302). In some implementations, the calibration signals can be set equal to each other, as described with respect to FIG. 1. The process 300 then monitors the output decisions of the comparator chain (304). In some implementations, monitoring includes counting output decisions using an up/down counter over a predetermined number comparator clock cycles (i.e., a counting cycle), as described with respect to FIG. 2. For example, for each high state the counter can increment and for each low state the counter can decrement. Thus, if the count is zero after completion of the counting cycle, then it can be reasonably assumed that an equal or acceptable distribution of high and low states has been achieved (i.e., a balanced comparator chain).

Based on the count generated in step (304), the process 300 determines if a desired probability distribution has been reached (306). If the desired probability distribution has be reached (e.g., register count=0), then the offset compensation value is maintained at its current value (312). If the desired probability distribution has not been reached, then the process 300 generates a compensation value based on the current distribution of the output decisions (308) and adds the compensation value to the signals in at least one point of the comparator chain (310). In some implementations, the current probability distribution can be determined by comparing the count of output decisions generated by an up/down counter against a threshold value (e.g., zero). For example, if the count is greater than zero, then the probability distribution is skewed to high states and the current compensation value can be decremented to balance the offset. Similarly, if the count is less than zero, then the current probability distribution is skewed to low states and the current compensation value can be incremented to balance the offset. After the new compensation value is determined, the monitoring step 304 can be repeated. The process 300 continues until the output of the comparator chain has converged to a stable state in which the probabilities of high and low output states are equal or acceptable. In some implementations, a scale factor is used to control the speed of convergence and the variance of the negative feedback loop at convergence, as described with respect to FIG. 2.

It will be understood by those skilled in the relevant art that the above-described implementations are merely exemplary, and many changes can be made without departing from the true spirit and scope of the present invention. Therefore, it is intended by the appended claims to cover all such changes and modifications that come within the true spirit and scope of this invention.

What is claimed is:

1. A calibration system for a comparator chain, comprising:
   a comparator configured for receiving a signal including noise;
   an unbalancing element coupled to the comparator and configured to add an unbalancing quantity to the signal in at least one point of a comparator chain; and
   a compensation circuit coupled to the comparator and the unbalancing element, the compensation circuit configured to monitor output states of the comparator, to determine if the output states are associated with a desired distribution associated with the noise, and if the output states are not associated with the desired distribution associated with the noise, to adjust the unbalancing quantity based on a distribution of the output states.

2. The system of claim 1, further comprising:
   an amplifier coupled between the unbalancing element and the comparator and configured for amplifying the signal.

3. The system of claim 1, where the comparator is a track-and-latch comparator.

4. The system of claim 1, where the signal is a differential signal and the comparator is a differential comparator.

5. The system of claim 1, where the compensating circuit further comprises:
   a counter and scale factor block coupled to the comparator and configured to provide a count of output states.

6. The system of claim 5, where the counter and scale factor block includes an up/down counter for counting output states.

7. The system of claim 6, where the counter and scale factor block includes scale factor logic coupled to the up/down counter and configured for controlling a speed of convergence of the output states.

8. The system of claim 5, where the compensation circuit further comprises:
   an accumulator coupled to the counter and scale factor block and configured to receive commands from the counter and scale factor block for incrementing, decrementing or maintaining a compensation value.

9. The system of claim 8, where the compensation circuit further comprises:
   a digital-to-analog converter (DAC) coupled to the accumulator and to the unbalancing element, where the DAC is configured to convert the compensation value provided by the accumulator into the unbalancing quantity to be added in the signal.

10. The system of claim 5, further comprising:
    calibration logic coupled to the counter and scale factor block and configured for programming a scale factor in the counter and scale factor block.

11. The system of claim 10, further comprising:
    an amplifier coupled to the unbalancing element and configured for amplifying the signal before the unbalancing quantity is added in to the signal; and
    switches coupled to the amplifier and the calibration logic, the switches configured for coupling the signal to the amplifier in response to a calibration control signal generated by the calibration logic.

12. A method of calibrating a comparator chain, comprising:
    providing a signal including noise to a comparator chain;
    monitoring output decisions of the comparator chain;
    determining if the output decisions are associated with a desired distribution associated with the noise; and
    if the output decisions are not associated with the desired distribution associated with the noise:
       determining an unbalancing quantity based on the monitored output decisions;
       adding the unbalancing quantity to the signal in at least one point of the comparator chain; and
       repeating the monitoring step.

13. The method of claim 12, where providing a signal includes providing a differential signal comprising at least two component signals having substantially equal values.

14. The method of claim 12, where monitoring output decisions and determining whether the output decisions are associated with a desired distribution includes:
    counting the number of output decisions; and
    comparing the count to at least one threshold value.

15. The method of claim 14, where comparing the count includes comparing the count to a threshold band.

16. The method of claim 14, where monitoring output decisions and determining whether the output decisions are associated with a desired distribution further includes:
    scaling the count by a scale factor before comparing the count to the at least one threshold value, where the scale factor is programmed for controlling a speed of convergence of the output decisions.

* * * * *